United States Patent
Lee et al.

(10) Patent No.: US 12,068,752 B2
(45) Date of Patent: Aug. 20, 2024

(54) DIGITAL LOOP FILTER OF LOW LATENCY AND LOW OPERATION AND CLOCK DATA RECOVERY CIRCUIT INCLUDING THE SAME

(71) Applicant: Samsung Electronics Co., Ltd., Suwon-si (KR)

(72) Inventors: Juyun Lee, Suwon-si (KR); Sunggeun Kim, Suwon-si (KR); Hyeonju Lee, Suwon-si (KR); Seuk Son, Suwon-si (KR); Kangjik Kim, Suwon-si (KR); Jaehyun Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/985,193

(22) Filed: Nov. 11, 2022

(65) Prior Publication Data

US 2023/0141322 A1    May 11, 2023

(30) Foreign Application Priority Data

Nov. 11, 2021  (KR) .................. 10-2021-0155148
Jul. 27, 2022   (KR) .................. 10-2022-0093462

(51) Int. Cl.
*H03L 7/08*    (2006.01)
*H03L 7/089*   (2006.01)
*H03L 7/093*   (2006.01)
*H03L 7/099*   (2006.01)

(52) U.S. Cl.
CPC ............ *H03L 7/0807* (2013.01); *H03L 7/089* (2013.01); *H03L 7/093* (2013.01); *H03L 7/0998* (2013.01)

(58) Field of Classification Search
CPC ....... H03L 7/0807; H03L 7/089; H03L 7/093; H03L 7/0998
See application file for complete search history.

(56) References Cited

U.S. PATENT DOCUMENTS

| 6,236,343 | B1 | 5/2001 | Patapoutian |
| 8,938,043 | B2 | 1/2015 | Bae et al. |
| 8,964,923 | B2 | 2/2015 | Vasani et al. |
| 9,264,219 | B1* | 2/2016 | Kang ............... H03L 7/093 |

(Continued)

FOREIGN PATENT DOCUMENTS

WO    2002005429 A2    1/2002

OTHER PUBLICATIONS

Extended European Search Report for issued Mar. 30, 2023 for corresponding EP Patent Application No. 22207007.0.

*Primary Examiner* — Jaison Joseph
(74) *Attorney, Agent, or Firm* — Muir Patent Law, PLLC

(57) ABSTRACT

A clock data recovery circuit includes a bang bang phase detector receiving data and a clock signal and determining whether a phase of the clock signal leads or lags a phase of the data, a digital loop filter receiving an output of the bang bang phase detector and filtering input jitter, an accumulator accumulating an output from the digital loop filter, an encoder encoding an output of the accumulator to generate a phase interpolation code, and a phase interpolator configured to generate the clock signal with an output phase in accordance with the phase interpolation code. The digital loop filter comprises a first sigma delta modulation (SDM) arithmetic block circuit connected to the bang bang phase detector.

17 Claims, 13 Drawing Sheets

(56) References Cited

U.S. PATENT DOCUMENTS

| | | | |
|---|---|---|---|
| 9,882,703 B1 | 1/2018 | Xu et al. | |
| 10,009,166 B2 | 6/2018 | Choi et al. | |
| 10,256,967 B2 | 4/2019 | Huang et al. | |
| 10,439,793 B2 | 10/2019 | Chen et al. | |
| 2002/0033714 A1* | 3/2002 | Perrott | H03L 7/087 |
| | | | 327/12 |
| 2008/0309420 A1 | 12/2008 | Fu et al. | |
| 2012/0109356 A1* | 5/2012 | Kong | H04L 7/033 |
| | | | 700/121 |
| 2013/0257485 A1* | 10/2013 | Nikaeen | H03L 7/093 |
| | | | 327/107 |
| 2016/0294398 A1* | 10/2016 | Verlinden | H03L 7/087 |
| 2018/0219704 A1* | 8/2018 | Song | H03L 7/0814 |
| 2018/0256248 A1* | 9/2018 | Bae | A61B 18/1233 |
| 2019/0354134 A1* | 11/2019 | Cali | G06F 1/12 |
| 2023/0141322 A1* | 5/2023 | Lee | H03L 7/0998 |
| | | | 375/376 |

\* cited by examiner

Case 1 : Clock leads

Case 2 : Clock lags

DIGITAL LOOP FILTER OF LOW LATENCY AND LOW OPERATION AND CLOCK DATA RECOVERY CIRCUIT INCLUDING THE SAME

CROSS-REFERENCE TO RELATED APPLICATIONS

This application is based on and claims priority under 35 U.S.C. § 119 to Korean Patent Application Nos. 10-2021-0155148 and 10-2022-0093462, filed on Nov. 11, 2021 and Jul. 27, 2022, in the Korean Intellectual Property Office, the disclosures of which are incorporated by reference herein in their entireties.

BACKGROUND

The inventive concept relates to a digital loop filter, and more particularly, to a digital loop filter of low latency and less operation and a clock data recovery circuit including the same.

With the recent leap of technology, demand for high-speed data transmission is also increasing day by day. To this end, a serial communication method of transmitting data at a high speed is used. The serial communication method may be used for various applications, such as communication between parts included in a system and movement of data in an integrated circuit as well as communication between independent devices through a detachable port. For example, the peripheral component interconnect express (PCIe) memory interface that is a high-speed serial computer expansion bus standard for using an expansion card operates at a speed of 16 Gbps per lane in Generation 4, and the M-PHY interface operates at a speed of about 24 Gbps per lane in Gear 5.

A clock data recovery circuit generating recovered clock signals from serial data by detecting a phase of a clock signal embedded in the serial data and generating recovered data from serial data by using recovered clock signals may be used for various devices and applications transmitting and receiving data by the serial communication method.

SUMMARY

The inventive concept relates to a clock data recovery circuit including a digital loop filter of low latency and less operation for increasing jitter tolerance.

According to an aspect of the inventive concept, a clock data recovery circuit includes a bang bang phase detector receiving data and a clock signal and determining whether a phase of the clock signal leads or lags a phase of the data, a digital loop filter receiving an output of the bang bang phase detector and filtering input jitter, an accumulator accumulating an output from the digital loop filter, an encoder encoding an output of the accumulator to generate a phase interpolation code, and a phase interpolator configured to generate the clock signal with an output phase in accordance with the phase interpolation code. The digital loop filter comprises a first sigma delta modulation (SDM) arithmetic block circuit connected to the bang bang phase detector.

According to an aspect of the inventive concept, a digital loop filter includes a proportional path including a first sigma delta modulation (SDM) arithmetic block circuit, and an integral path including a second SDM arithmetic block circuit and an integrator. The integral path is configured in parallel with the proportional path. The first SDM arithmetic block circuit performs a division operation on an input of the digital loop filter using a first SDM coefficient as a divisor. The second SDM arithmetic block circuit performs a division operation on an output of the first SDM arithmetic block circuit using a second SDM coefficient as a divisor.

According to another aspect of the inventive concept, a device includes a receiving circuit, and a transmitting circuit transmitting data to the receiving circuit through a channel. The receiving circuit comprises a clock data recovery circuit. The clock data recovery circuit includes a bang bang phase detector receiving the data and a clock signal and determining whether a phase of the clock signal leads or lags a phase of the data, a digital loop filter receiving an output from the bang bang phase detector and filtering input jitter, an accumulator accumulating an output from the digital loop filter, an encoder encoding an output of the accumulator to generate a phase interpolation code, and a phase interpolator generating the clock signal with an output phase in accordance with the phase interpolation code. The digital loop filter includes a proportional path including a first sigma delta modulation (SDM) arithmetic block circuit, and an integral path parallel with the proportional path and including a second SDM arithmetic block circuit and an integrator.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Hereinafter, an embodiment of the inventive concept will be described in detail with reference to the accompanying drawings.

Figure 1:
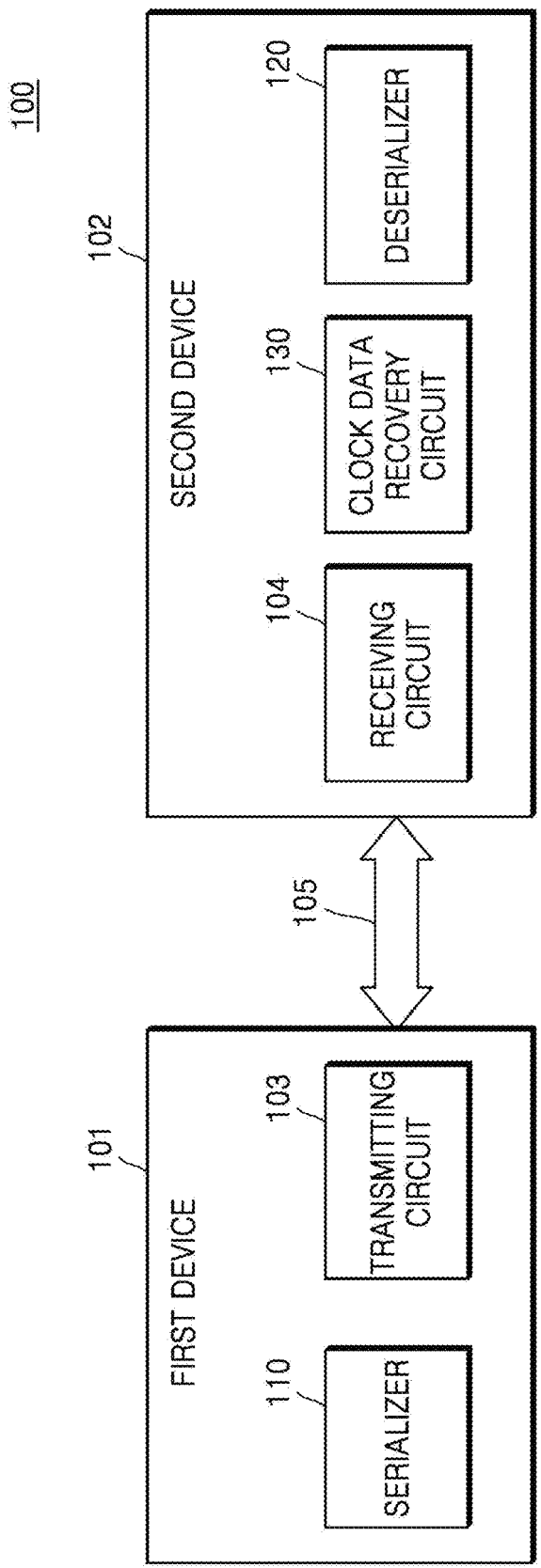
FIG. 1 is a block diagram illustrating a data transmission and reception system according to an embodiment.

FIG. 1 is a block diagram illustrating a data transmission and reception system 100 according to an embodiment.

Referring to FIG. 1, the data transmission and reception system 100 may include a first device 101, a second device 102, and a transmission line 105. The first device 101 for transmitting data may transmit data to the second device 102 via the transmission line 105 through a transmitting circuit 103. In an embodiment, the first device 101 may only transmit the data to the second device 102, may separately encode the data to transmit the encoded data, or may transmit the data together with a clock signal.

According to an embodiment, the first device 101 may further include a serializer 110. The serializer 110 may divide the data to be transmitted to the second device 102 according to a predetermined unit and may transmit the data as burst data according to a high-speed serial interface.

The second device 102 may receive the data transmitted by the first device 101 through the transmission line 105 and a receiving circuit 104. In an embodiment, the second device 102 may further include a decoder for decrypting the encoded data. In various embodiments, the first device 101 may be referred to as a transmitting device and the second device 102 may be referred to as a receiving device.

According to an embodiment, the second device 102 may further include a deserializer 120. The deserializer 120 may receive an input data signal including a bit sequence to generate an output data signal including parallel data.

According to an embodiment, the second device 102 may further include a clock data recovery circuit 130. The clock data recovery circuit 130 may receive the input data signal transmitted by the first device 101 in a serial communication method and may generate the output data signal from the input data signal. The output data signal may be referred to as a recovered data signal. The input data signal may include a series of bits, that is, a bit sequence. For example, the input data signal may include a packet of m bits listed in sequence. The clock data recovery circuit 130 may recognize serial data included in the input data signal by sampling the bit sequence included in the input data signal and may generate the output data signal including the parallel data from the serial data.

According to an embodiment, the input data signal may include a clock signal as well as the serial data. A data signal including the serial data may be received from the first device 101 through the transmission line 105, and the clock signal may be received through a clock line (not shown) separate from the transmission line 105. In an embodiment, the first device 101 may have a clock signal included in the data signal, and the second device 102 may recover the clock signal included in the data signal to recognize the serial data. The second device 102 may sample the bit sequence by recovering the clock signal including a change in the data signal so that a data transfer rate may increase. The clock signal included in the input data signal may be referred to as an embedded clock.

In various embodiments, the transmission line 105 may be referred to as one of various terms including a transmission channel and a data channel. In addition, as illustrated in FIG. 1, the transmission line 105 is for physical or electrical connection. However, the inventive concept is not limited thereto. According to various embodiments, the transmission line 105 may refer to a channel through which data is transmitted wirelessly.

Figure 2:
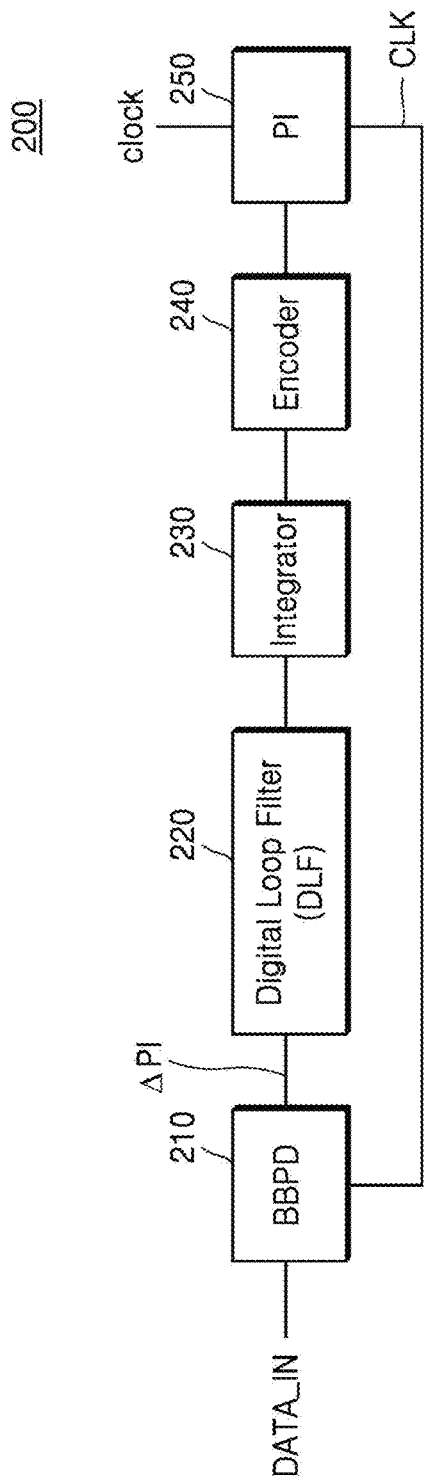
FIG. 2 is a block diagram illustrating a clock data recovery circuit according to an embodiment.

FIG. 2 is a block diagram illustrating a clock data recovery circuit 200 according to an embodiment.

Referring to FIG. 2, the clock data recovery circuit 200 may include a bang bang phase detector 210 (i.e., a binary phase detector), a digital loop filter 220, an integrator 230, an encoder 240, and a phase interpolator 250.

According to an embodiment, the bang bang phase detector 210 may receive a signal from a comparative sampler (not shown) to determine whether an input data signal DATA_IN (i.e., data) matches (i.e., is in phase with) a clock signal CLK or whether a clock signal CLK leads/lags an input data signal DATA_IN. The bang bang phase detector 210 may determine whether the clock signal CLK locks in with (i.e., is in phase with) or leads/lags the input data signal DATA_IN based on changes in output values of the comparative sampler (not shown), which are received during a predefined unit interval (UI). For example, the bang bang phase detector 210 may compare the transition of the clock signal CLK output from the phase interpolator 250 with that of the input data signal DATA_IN to determine whether a phase of the clock signal CLK leads or lags that of the input data signal DATA_IN, as described in detail with reference to FIG. 3. In an embodiment, the bang bang phase detector 210 may extract a sign of a phase error between a phase of the input data signal DATA_IN and a phase of the clock signal CLK. For example, the sign of the phase error may represent whether the phase of the clock signal CLK leads or lags the phase of the input data signal DATA_IN.

According to an embodiment, the digital loop filter 220 may receive a phase error signal $\Delta pi$ which is acquired from the bang bang phase detector 210, to control the phase of the clock signal CLK so that the input data signal DATA_IN and clock signal CLK lock in with other (i.e., are in phase with each other). In an embodiment, the phase error signal $\Delta pi$ may represent an accumulation of clock leadings and clock lags for a predetermined clock duration. For example, a value sign of the clock leadings is positive, a value sign of the clock laggings is negative. The phase error signal $\Delta pi$ would be increased when the clock signal leads to the input data signal DATA_IN successively. The phase error signal $\Delta pi$ would be decreased when the clock signal lags to the input data signal DATA_IN successively. Even though not described in FIG. 2, the phase error signal $\Delta pi$ would be calculated through a deserializer and an adder circuit between the BBPD 210 and DLF filter 220. The digital loop filter 220 may determine that the input data signal DATA_IN and clock signal CLK are locked in with each other when a value of the phase error signal $\Delta pi$ is dithering near "0". For example, when the phase of the clock signal CLK received by the bang bang phase detector 210 is represented by a leading value or a lagging value and when the received leading or lagging value satisfies a predetermined value or is greater than the predetermined value, the digital loop filter 220 may inform the phase interpolator 250 of a changed value of a phase interpolation code to control the phase of the clock signal CLK, as described in detail with reference to FIG. 4. In an embodiment, the phase interpolation code is changed in response to that the phase error signal $\Delta pi$ is greater than a first threshold of positive value or that the phase error signal $\Delta pi$ is less than a second threshold of negative value.

According to an embodiment, the integrator 230 may sum an output and input thereof to provide the sum thereto as an input. For example, the integrator 230 may implemented with adder and flip-flop. The flip-flop provides output to the encoder 240 and feedback to the adder. The adder sums the input which is from the DLF 220 and the output from the flip-flop. The adder provides the sums to the flip-flop. That is, because the integrator 230 adds the input to the output, the integrator 230 may be referred to as an accumulator. In an embodiment, the integrator 230 may sum an output of the digital loop filter 220. According to an embodiment, the integrator 230 may be arranged between the digital loop filter 220 and the phase interpolator 250. When a frequency offset is provided between the input data signal DATA_IN and the clock signal CLK, in order to track the phase of the clock, in the clock data recovery circuit 200 using the phase interpolator 250, the integrator 230 may be arranged at a next end of the digital loop filter 220 and at a front end of the phase interpolator 250.

According to an embodiment, an encoder 240 may encode an accumulated signal through the integrator 230. The encoded output of the encoder 240 may correspond to the phase interpolation code.

According to an embodiment, the phase interpolator 250 may receive the phase interpolation code from the encoder 240 to control the phase of the output clock. For example, the phase interpolator 250 may receive a source clock signal including a plurality of phase clock signals from a phase locked loop (PLL). The phase interpolator 250 may generate a clock signal CLK having a new phase by setting weights of the plurality of phase clock signals to be different from one another based on the phase interpolation code.

Figure 3:
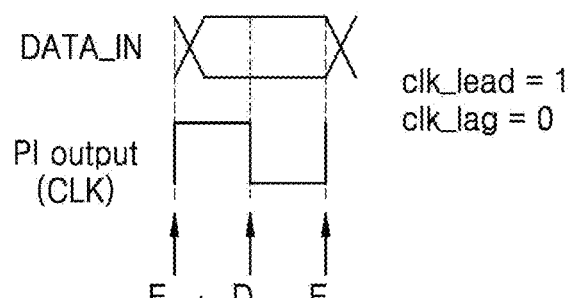
FIG. 3 is a view illustrating the bang bang phase detector of FIG. 2.
Figure 3:
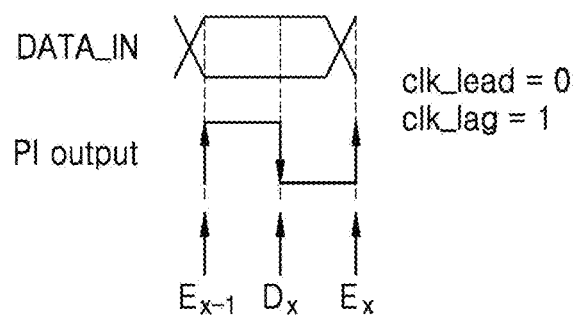
Figure 3:
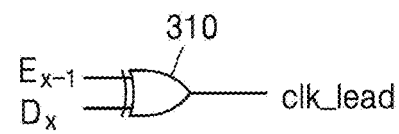
Figure 3:
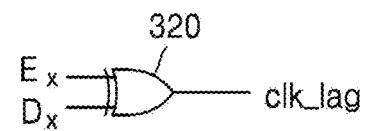

FIG. 3 is a view illustrating the bang bang phase detector 210 of FIG. 2.

Referring to FIGS. 2 and 3, the bang bang phase detector 210 may include a first XOR gate 310 and a second XOR gate 320. An output of the first XOR gate 310 may be a signal representing whether the clock signal CLK leads the input data signal DATA_IN (i.e., a signal representing whether a phase of the clock signal CLK leads a phase of the input data signal DATA_IN). An output of the second XOR gate 320 may be a signal representing whether the clock signal CLK lags the input data signal DATA_IN (i.e., a signal representing whether a phase of the clock signal CLK lags a phase of the input data signal DATA_IN). The first XOR gate 310 and the second XOR gate 320 may compare a logic value of the input data signal DATA_IN at a falling edge Dx of the clock signal CLK with logic values of the input data signal DATA_IN at each rising edges $E_{x-1}$ and $E_x$ of the clock signal CLK to generate outputs representing of whether the clock signal CLK leads the input data signal DATA_IN or whether the clock signal CLK lags the input data signal DATA_IN. For example, inputs to the first XOR gate 310 may be a logic level of the input data signal DATA_IN at a falling edge $D_x$ of the clock signal CLK and a logic level of the input data signal DATA_IN at a preceding rising edge $E_{x-1}$ of the clock signal CLK. When the inputs to the first XOR gate 310 are different from each other, the output of the first XOR gate 310 is a logic level of 'logic high," and when the inputs to the first XOR gate 310 are the same as each other, the output of the first XOR gate 310 is a logic level of 'logic low." For example, inputs to the second XOR gate 320 may be a logic level of the input data signal DATA_IN at the falling edge $D_x$ of the clock signal CLK and a logic level of the input data signal DATA_IN at a following rising edge $E_x$ of the clock signal CLK. When the inputs to the second XOR gate 320 are different from each other, the output of the second XOR gate 320 is a logic level of 'logic high," and when the inputs to the second XOR gate 320 are the same as each other, the output of the second XOR gate 320 is a logic level of 'logic low."

According to an embodiment, in a first case Case 1, the clock signal CLK leads the input data signal DATA_IN. For example, the input data signal DATA_IN is a differential signal of two complementary signals and one of the two complementary signals of the input data signal DATA_IN (e.g., a complementary signal of 'logic high') is an input to the first XOR gate 310. The first XOR gate 310 may perform an XOR operation on logic levels of the input data signal DATA_IN at the falling edge $D_x$ of the clock signal CLK and a previous rising edge $E_{x-1}$ (i.e., a preceding rising edge) of the clock signal CLK. For example, the inputs to the first XOR gate 310 are 'logic high' of the input data signal DATA_IN at the falling edge $D_x$ of the clock signal CLK and 'logic low' of the input data signal DATA_IN at the previous rising edge $E_{x-1}$ of the clock signal CLK, and the output of the first XOR gate 310 may be 'logic high'. The inputs to the second XOR gate 320 are 'logic high' of the input data signal DATA_IN at the falling edge $D_x$ of the clock signal CLK and 'logic high' of the input data signal DATA_IN at the following rising edge $E_x$ of the clock signal CLK, and the output of the second XOR gate 320 may be 'logic low'. In an example, when the input data signal DATA_IN is a differential signal of two complementary signals and one of the two complementary signals of the input data signal DATA_IN (e.g., a complementary signal of 'logic low') is an input to the first XOR gate 310, an XOR operation may be performed on logic levels of the input data signal DATA_IN at the falling edge $D_x$ and the previous rising edge $E_{x-1}$ (i.e., a preceding rising edge) that are inputs of the first XOR gate 310. The inputs to the first XOR gate 310 are 'logic low' of the input data signal DATA_IN at the falling edge $D_x$ of the clock signal CLK and 'logic high' of the input data signal DATA_IN at the previous rising edge $E_{x-1}$, and the output of the first XOR gate 310 may be 'logic high'. The inputs to the second XOR gate 320 are 'logic low' of the input data signal DATA_IN at the falling edge $D_x$ of the clock signal CLK and 'logic low' of the input data signal DATA_IN at the following rising edge $E_x$ of the clock signal CLK, and the output of the second XOR gate 320 may be 'logic low'. That is, it may be noted that, when the clock signal CLK leads the input data signal DATA_IN, the first XOR gate 310 outputs a 'logic high' signal and the second XOR gate 320 outputs a 'logic low' signal.

According to an embodiment, in a second case Case 2, the clock signal CLK lags the input data signal DATA_IN. For example, the input data signal DATA_IN is a differential signal of two complementary signals and one of the two complementary signals of the input data signal DATA_IN (e.g., a complementary signal of 'logic high') is an input to the first XOR gate 310. The first XOR gate 310 may perform an XOR operation on logic levels of the input data signal DATA_IN at the falling edge $D_x$ of the clock signal CLK and the previous rising edge $E_{x-1}$ of the clock signal CLK. The inputs to the first XOR gate 310 are 'logic high' of the input data signal DATA_IN at the falling edge $D_x$ of the clock signal CLK and 'logic high' of the input data signal DATA_IN at the previous rising edge $E_{x-1}$, and the output of the first XOR gate 310 may be 'logic low'. The inputs to the second XOR gate 320 are 'logic high' of the input data signal DATA_IN at the falling edge $D_x$ of the clock signal CLK and 'logic low' of the input data signal DATA_IN at the following rising edge $E_x$ of the clock signal CLK, and the output of the second XOR gate 320 may be 'logic high'. In an example, the input data signal DATA_IN is a differential signal of two complementary signals, and one of the two complementary signals of the input data signal DATA_IN (e.g., a complementary signal of 'logic low') is an input to the first XOR gate 310. The first XOR gate 310 may perform an XOR operation on logic levels of the input data signal DATA_IN at the falling edge $D_x$ of the clock signal CLK and the previous rising edge $E_{x-1}$ of the clock signal CLK. The inputs to the first XOR gate 310 are 'logic low' of the input data signal DATA_IN at the falling edge $D_x$ of the clock signal CLK and 'logic low' of the input data signal DATA_IN at the previous rising edge $E_{x-1}$, and the output of the first XOR gate 310 may be 'logic low'. The inputs to the second XOR gate 320 are 'logic low' of the input data signal DATA_IN at the falling edge $D_x$ of the clock signal CLK and 'logic high' of the input data signal DATA_IN at the following rising edge $E_x$ of the clock signal CLK, and the output of the second XOR gate 320 may be 'logic high'. That is, it may be noted that, when the clock signal CLK lags the input data signal DATA_IN, the first XOR gate 310 outputs a 'logic low' signal and the second XOR gate 320 outputs a 'logic high' signal.

Figure 4:
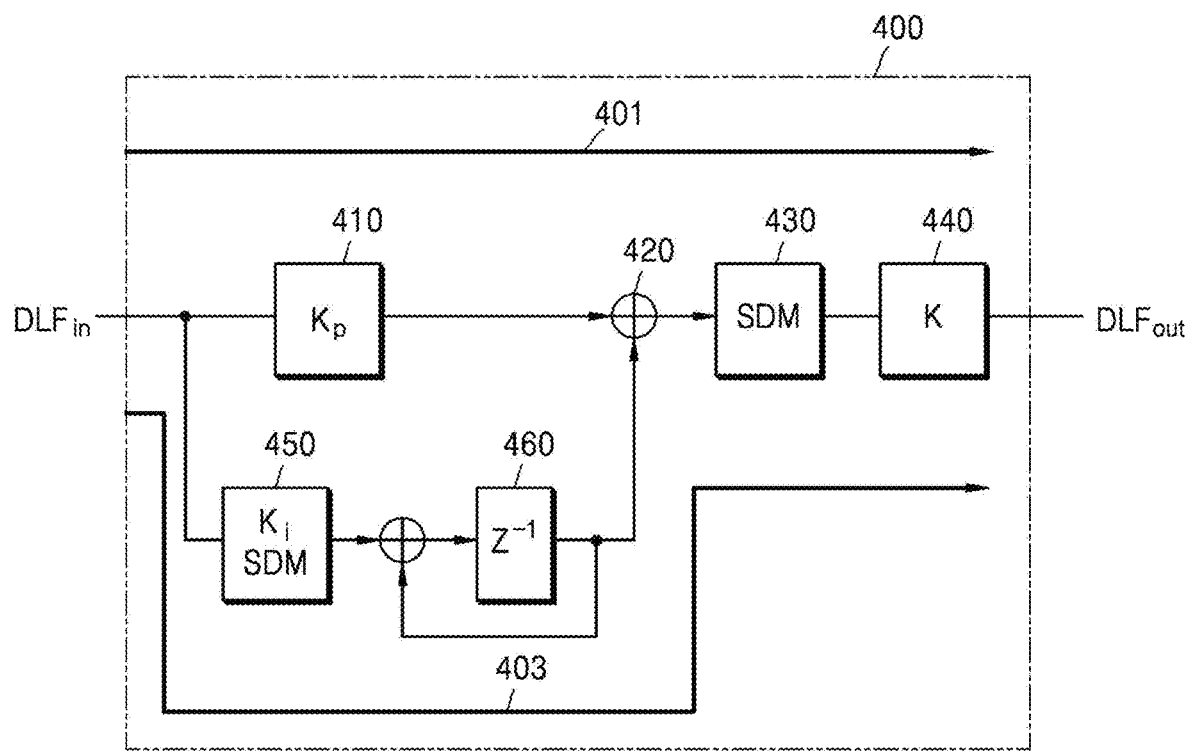
FIG. 4 is a block diagram illustrating a digital loop filter according to a comparative example.

FIG. 4 is a block diagram illustrating a digital loop filter 400 according to a comparative example.

Referring to FIG. 4, the digital loop filter 400 may include a proportional path 401 and an integral path 403.

According to an embodiment, the proportional path 401 may include a first arithmetic block 410, a summer 420 (i.e., an adder circuit), a third arithmetic block 430, and a fourth arithmetic block 440. The proportional path 401 may rapidly track a phase difference between a clock signal and data (i.e., an input data signal) as inputs. For example, the proportional path 401 may track jitter of a high frequency. The jitter may be included in the input data signal DATA_IN. The tracking of the jitter indicates that a phase difference between the jitter and the input data signal DATA_IN is decreased. The first arithmetic block 410 may multiply an input $DLF_{in}$ of the digital loop filter 400, which is received from the bang bang phase detector 210, by a coefficient $K_p$. The summer 420 may sum the input $DLF_{in}$ of the digital loop filter 400, which is multiplied by the coefficient $K_p$ through the first arithmetic block 410, with the input $DLF_{in}$ of the digital loop filter 400, which is converted through the integral path 403. The third arithmetic block 430 may perform sigma delta modulation. For example, the third arithmetic block 430 may divide a value received from the summer 420 by a coefficient SDM. The fourth arithmetic block 440 may multiply an input received from the third arithmetic block 430 by K to generate an output $DLF_{out}$ of the digital loop filter 400. According to an embodiment, a gain of input versus output of the proportional path 401 including the first to fourth arithmetic blocks 410 to 440 may be '$K_p$*SDM*K'.

According to an embodiment, the integral path 403 may include a fifth arithmetic block 450 and an integrator 460. The integral path 403 may track a phase difference between a clock signal and data as inputs. For example, the integral path 403 may track jitter of a low frequency. The fifth arithmetic block 450 may divide the input $DLF_{in}$ of the digital loop filter 400 by a coefficient $K_i$*SDM. The integrator 460 may sum an output thereof and an output of the fifth arithmetic block 450 to accumulate the sum. According to an embodiment, the gain of the integral path 403 including the fifth arithmetic block 450 and the integrator 460 may be '$K_i$*SDM*1/(1−$Z^{-1}$)*SDM*K'. The gain of the integral path 403 may be a small value of about 1/1000 of the gain of the proportional path 401.

According to the comparative example described above, the proportional path 401 of the digital loop filter 400 converts the input $DLF_{in}$ into the output $DLF_{out}$ via the first arithmetic block 410, the summer 420, the third arithmetic block 430, and the fourth arithmetic block 440. However, because latency occurs by time spent on operation whenever the operation is performed by the first arithmetic block 410, the third arithmetic block 430, and the fourth arithmetic block 440 and retiming occurs whenever the operation is performed, latency occurring via the proportional path 401 may be large enough. Because the integral path 403 tracks the jitter of the low frequency, in an environment in which data is transmitted in a high frequency through a high-speed serial interface, the latency of the proportional path 401 may reduce a bit error rate (BER) of transmission and reception data and may deteriorate jitter performance.

Figure 5A:
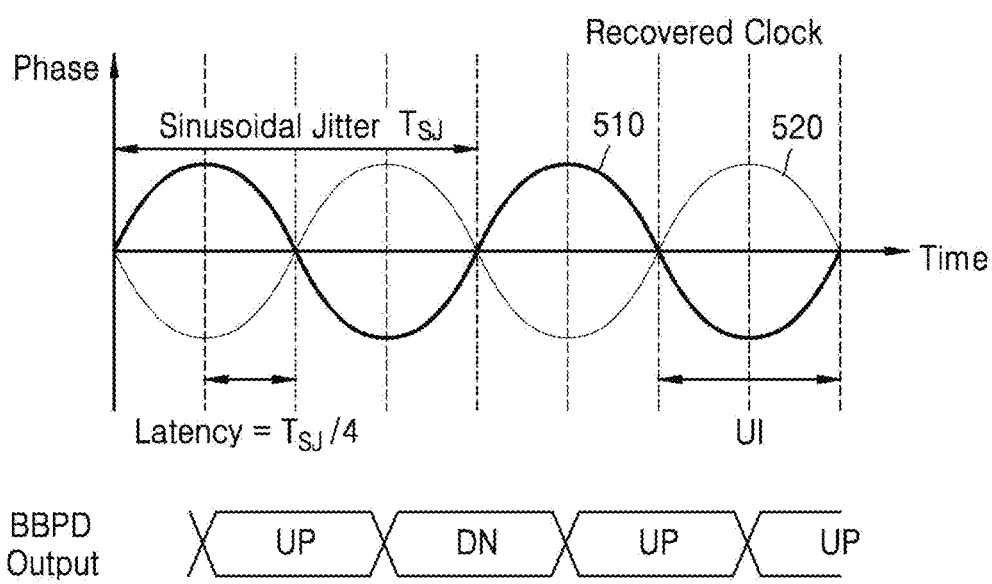
FIG. 5A is a graph illustrating a recovered clock and a sinusoidal jitter according to a comparative example.
Figure 5B:
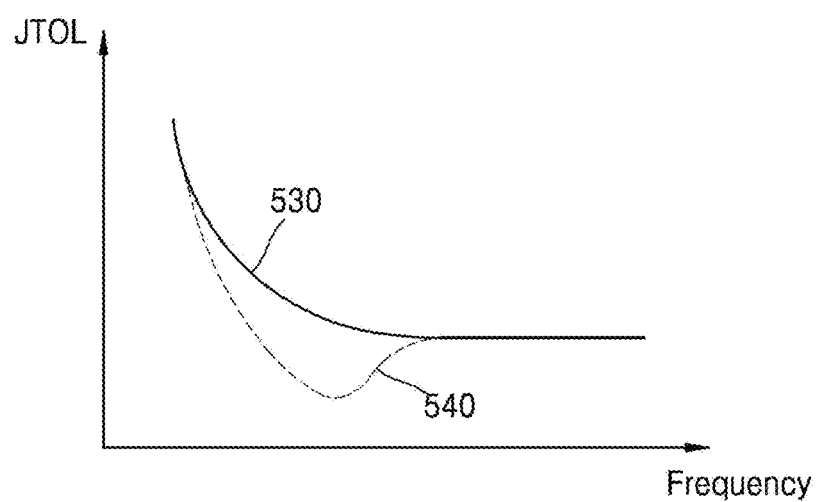
FIG. 5B is a graph illustrating jitter tolerance in accordance with a frequency.

FIG. 5A is a graph illustrating a recovered clock and a sinusoidal jitter according to a comparative example, and FIG. 5B is a graph illustrating jitter tolerance in accordance with a frequency.

Referring to FIG. 5A, in order to measure jitter tolerance of the clock data recovery circuit including the digital loop filter 400 according to the comparative example illustrated in FIG. 4, a sinusoidal jitter signal 510 may be input. For example, the sinusoidal jitter signal 510 may have a period of 2 UIs.

According to an embodiment, the total latency of the clock data recovery circuit including the digital loop filter 400 may be 0.5 UI. For example, a section from a point in time at which an input data signal DATA_IN (see, FIGS. 2 and 3) is input to the bang bang phase detector 210 to a point in time at which a clock signal CLK (see, FIGS. 2 and 3) output from the phase interpolator 250 is input to the bang bang phase detector 210 may be the total latency. When the total latency is approximately ¼ (for example, 0.5 UI) of the period of the sinusoidal jitter signal 510, a clock signal 520 recovered by the phase interpolator 250 may lag the sinusoidal jitter signal 510 by ½ (for example, 1 UI) of the period of the sinusoidal jitter signal 510. That is, the sinusoidal jitter signal 510 and the recovered clock signal 520 may have opposite phases. That is, the clock data recovery circuit including the digital loop filter 400 may not perform normal data sampling only by receiving the sinusoidal jitter signal 510 of small amplitude as an input.

Referring to FIG. 5B, a change in jitter tolerance in accordance with a frequency of the sinusoidal jitter signal 510 is illustrated. For example, a first graph 530 illustrates jitter tolerance in accordance with a change in frequency of the sinusoidal jitter signal 510 when the total latency is small enough. A second graph 540 illustrates jitter tolerance in accordance with a change in frequency of the sinusoidal jitter signal 510 when the total latency increases. Referring to the second graph 540, when the total latency increases so that the total latency is approximately ¼ (for example, 0.5 UI) of the period of the sinusoidal jitter signal 510, underdamping occurs so that the jitter tolerance rapidly deteriorates. At this time, because latency occurring in the digital loop filter 400 has the highest percentage in the total latency, it is desirable to minimize the latency occurring in the digital loop filter 400.

Figure 6:
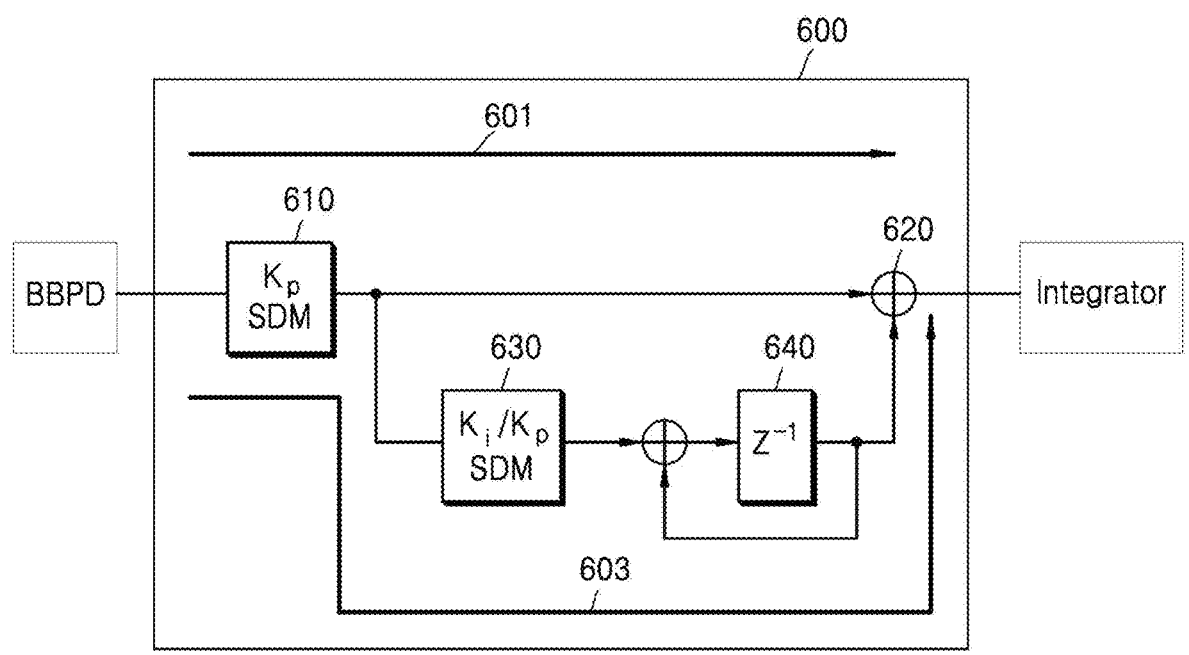
FIG. 6 illustrates an equivalent digital loop filter according to an embodiment.

FIG. 6 illustrates an equivalent digital loop filter 600 according to an embodiment.

Referring to FIG. 6, the equivalent digital loop filter 600 may include a proportional path 601 and an integral path 603.

According to an embodiment, the proportional path 601 may include a first equivalent arithmetic block 610 and a summer 620. The proportional path 601 may rapidly track a phase difference between a clock signal and data (e.g., the clock signal CLK and the input data signal DATA_IN as described with reference to FIG. 3) as inputs. The first equivalent arithmetic block 610 may divide an input $DLF_{in}$ of the equivalent digital loop filter 600, which is received from the bang bang phase detector 210, by the coefficient $K_p$.

Referring to the comparative example of FIG. 4, a gain $DLF_{out}/DLF_{in}$ of the digital loop filter 400 may have a very small value (<1). Therefore, because a final output of the equivalent digital loop filter 600 must have a small value, the equivalent digital loop filter 600 may include the first equivalent arithmetic block 610 so that the equivalent digital loop filter 600 has the same gain as a transfer function of the proportional path 401 of the digital loop filter 400 of FIG. 4. At this time, from a point of view of the proportional path 601, it is not necessary for the equivalent digital loop filter 600 to repeatedly perform a multiplication operation using the coefficient $K_p$ on the input $DLF_{in}$ of the equivalent digital loop filter 600, to perform a division operation using a coefficient SDM, and to perform a multiplication operation using the coefficient $K_p$ again. As described above with reference to FIGS. 5A and 5B, in the proportional path 401, latency occurs whenever a plurality of arithmetic blocks (for example, the first arithmetic block 410, the third arithmetic block 430, and the fourth arithmetic block 440) are passed and the latency is dominant in the total latency. For example, the proportional path 601 of the equivalent digital loop filter 600 according to an embodiment may perform a division operation on a result of an operation performed by the plurality of arithmetic blocks (for example, the first arithmetic block 410, the third arithmetic block 430, and the fourth arithmetic block 440) of the proportional path 401 of the digital loop filter 400 by an equivalent coefficient only once. Because the gain of the proportional path 601 is less than 1, the first equivalent arithmetic block 610 may equivalently perform a division operation only once. In an embodiment, the proportional path 601 of the equivalent digital loop filter 600 according to an embodiment may perform a division operation, using a coefficient $K_p$*SDM as a divisor, on an output of the bang bang phase detector. Using the coefficient $K_p$*SDM as a divisor may have an effect that a division operation is performed on a result of an operation performed by the plurality of arithmetic blocks (for example, the first arithmetic block 410, the third arithmetic block 430, and the fourth arithmetic block 440) of the proportional path 401 of the digital loop filter 400. Because the gain of the proportional path 601 is less than 1, the first equivalent arithmetic block 610 may equivalently perform a division operation only once using the coefficient $K_p$*SDM.

The summer 420 may sum the input $DLF_{in}$ of the equivalent digital loop filter 600, which is multiplied by $K_p$*SDM through the first equivalent arithmetic block 610, and the input $DLF_{in}$ of the equivalent digital loop filter 600, which is converted through the integral path 603. According to an embodiment, the gain of input to output of the proportional path 601 including the first equivalent arithmetic block 610 may be '$K_p$*SDM'.

According to an embodiment, the integral path 603 may include a third equivalent arithmetic block 630 and an integrator 640. The integral path 603 may track a phase difference between a clock signal and data as inputs. The third equivalent arithmetic block 630 may divide the input $DLF_{in}$ of the equivalent digital loop filter 600 by $K_i$*SDM. For example, the third equivalent arithmetic block 630 may perform a division operation on an output of the first equivalent arithmetic block 610. The integrator 640 may sum an output thereof and an output of the third equivalent arithmetic block 630 to accumulate the sum. For example, the integral path 603 may perform a division operation, using a coefficient $K_i/K_p$*SDM as a divisor, on a value obtained by the first equivalent arithmetic block 610 performing division operation using a coefficient $K_p$*SDM on the input $DLF_{in}$ of the equivalent digital loop filter 600. Therefore, when coefficients of '$K_p$*SDM' and '$K_i/K_p$*SDM' are controlled, the equivalent digital loop filter 600 may have the same gain as that of the digital loop filter 400 of FIG. 4 and may operate at less latency and using less operations compared to the digital loop filter 400 of FIG. 4.

Figure 7:
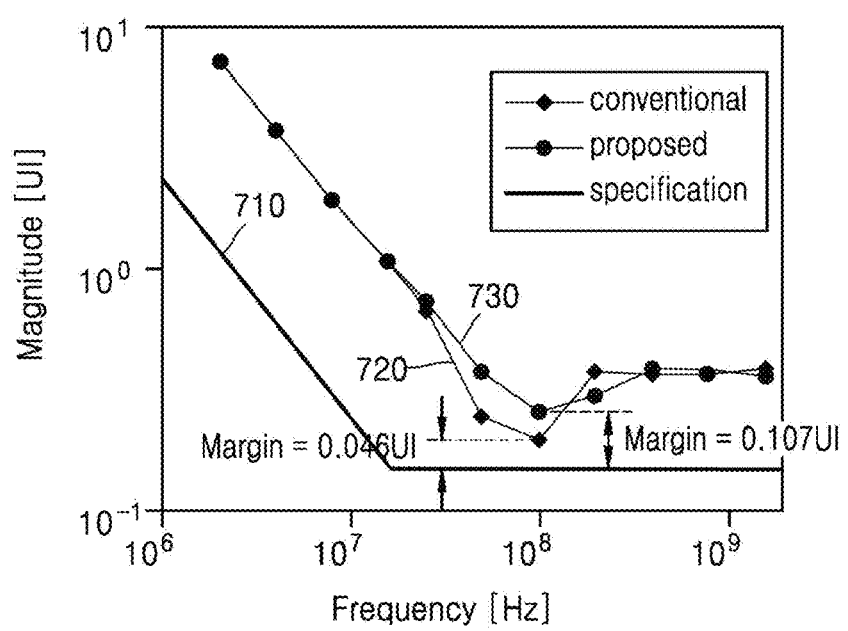
FIG. 7 is a graph illustrating jitter tolerance of a clock data recovery circuit including a digital loop filter according to an embodiment.

FIG. 7 is a graph illustrating jitter tolerance of a clock data recovery circuit including the equivalent digital loop filter 600 according to an embodiment.

Referring to FIG. 7, a first curve 710 illustrates a standard specification of M-PHY Gear 5. In other words, although jitter tolerance deteriorates in accordance with a change in frequency, jitter tolerance greater than that of the first curve 710 must be provided.

A second curve 720 illustrates a result of measuring jitter tolerance of a clock data recovery circuit including the digital loop filter 400. For example, the second curve 720 may illustrate a result of measuring jitter performance of a clock data recovery circuit including the digital loop filter 400 of FIG. 4. At this time, it may be noted from the second curve 720 that underdamping occurs so that the jitter tolerance rapidly deteriorates in a bandwidth (for example, $10^8$ Hz) of the clock data recovery circuit. It may be noted that the jitter tolerance when underdamping occurs has a margin of 0.046 UI with the jitter tolerance of the first curve 710.

A third curve 730 illustrates a result of measuring jitter tolerance of a clock data recovery circuit including the equivalent digital loop filter 600 according to an embodiment. For example, the third curve 730 may illustrate a result of measuring jitter performance of a clock data recovery circuit including the equivalent digital loop filter 600 of FIG. 6. At this time, it may be noted from the third curve 730 that underdamping occurs so that the jitter tolerance rapidly deteriorates in a bandwidth (for example, $10^8$ Hz) of the clock data recovery circuit. It may be noted that the jitter tolerance when underdamping occurs has a margin of 0.107 UI with the jitter tolerance of the first curve 710. That is, the clock data recovery circuit including the equivalent digital loop filter 600 of FIG. 6 in which latency is reduced may secure the margin of the jitter tolerance about 2.3 times of that of the conventional clock data recovery circuit.

Figure 8:
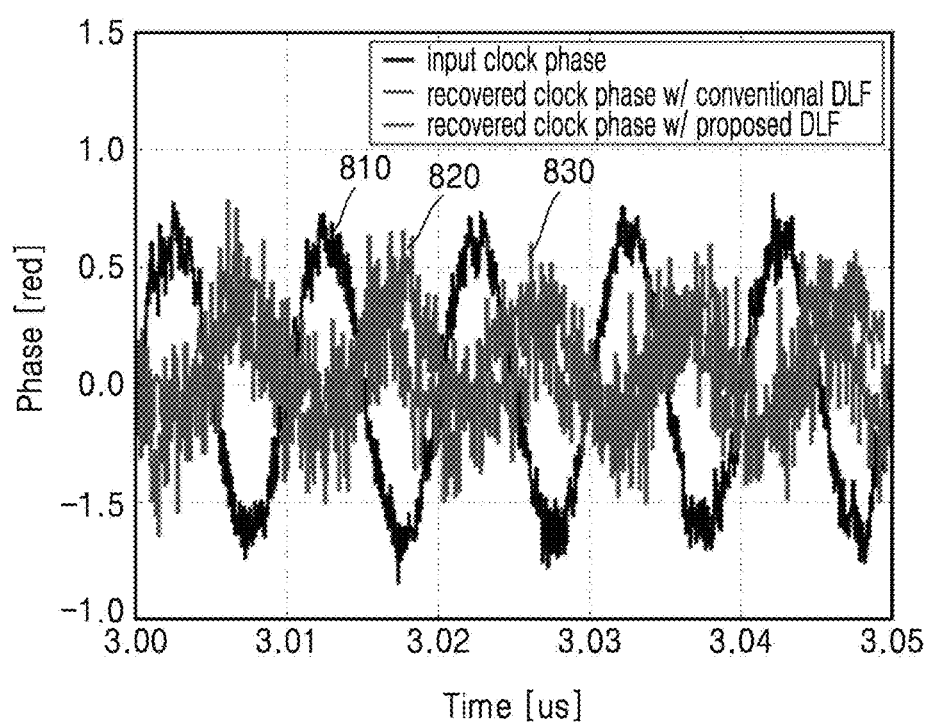
FIG. 8 is a graph illustrating a recovered clock signal of a clock data recovery circuit including an equivalent digital loop filter according to an embodiment.

FIG. 8 is a graph illustrating a recovered clock signal of the clock data recovery circuit including the equivalent digital loop filter 600 according to an embodiment.

Referring to FIG. 8, clock signals respectively recovered by the clock data recovery circuit including the digital loop filter 400 according to the comparative example of FIG. 4 and the clock data recovery circuit including the equivalent digital loop filter 600 of FIG. 6 are illustrated.

In order to measure jitter tolerance, a first signal 810 as a sinusoidal jitter signal may be input. At this time, a frequency of the first signal 810 may be 100 MHz. A second signal 820 illustrates the clock signal recovered by the clock data recovery circuit including the digital loop filter 400 according to the comparative example of FIG. 4. It may be noted that the second signal 820 is recovered to have a phase opposite to that of the first signal 810.

A third signal 830 illustrates the clock signal recovered by the clock data recovery circuit including the equivalent digital loop filter 600 of FIG. 6. Unlike the second signal 820 having the phase opposite to that of the first signal 810, it may be noted that the third signal 830 is recovered to lag the first signal 810 by about 0.005 μs. That is, the third signal 830 may be recovered to have a phase difference less than that of the second signal 820.

Figure 9:
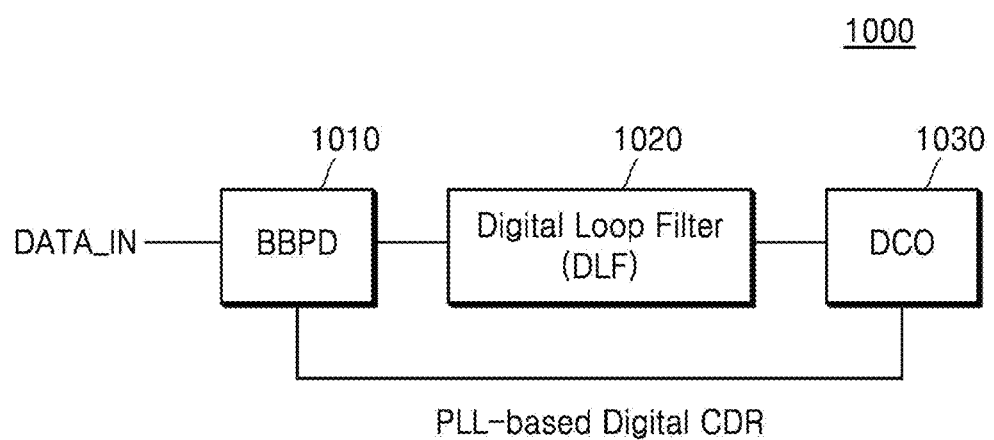
FIG. 9 is a block diagram of a digital clock data recovery circuit according to an embodiment.

FIG. 9 is a block diagram of a digital clock data recovery circuit 1000 according to an embodiment.

Referring to FIG. 9, the digital clock data recovery circuit 1000 may include a bang bang phase detector 1010, a digital loop filter 1020, and a digitally controlled oscillator (DCO) 1030.

According to an embodiment, the bang bang phase detector 1010 may receive a signal from a comparative sampler to determine whether data matches a clock signal or whether a clock signal leads/lags an input data signal DATA_IN. The bang bang phase detector 1010 may determine whether the clock signal locks in with or leads/lags the input data signal DATA_IN based on changes in output values of the comparative sampler (not shown), which are received during a predefined UI. For example, the bang bang phase detector 1010 may compare the transition of the clock signal output from the DCO 1030 to be divided with that of the input data signal DATA_IN to determine whether a phase of the clock signal leads or lags that of the input data signal DATA_IN.

According to an embodiment, the digital loop filter 1020 may receive a phase error signal Δpi from the bang bang phase detector 1010 to control the phase of the clock signal so that the input data signal DATA_IN and clock signal CLK are locked in with each other. The digital loop filter 1020 may determine that the input data signal DATA_IN and clock signal are locked in each other when a value of the phase error signal Δpi is dithering near "0". For example, the digital loop filter 1020 may receive a leading value or a lagging value of the phase of the clock signal received from the bang bang phase detector 1010 and may generate a DCO control code to provide the generated DCO control code to the DCO 1030. According to an embodiment, the DCO 1030 may generate a signal of a variable frequency based on the DCO control code received from the digital loop filter 1020.

Figure 10:
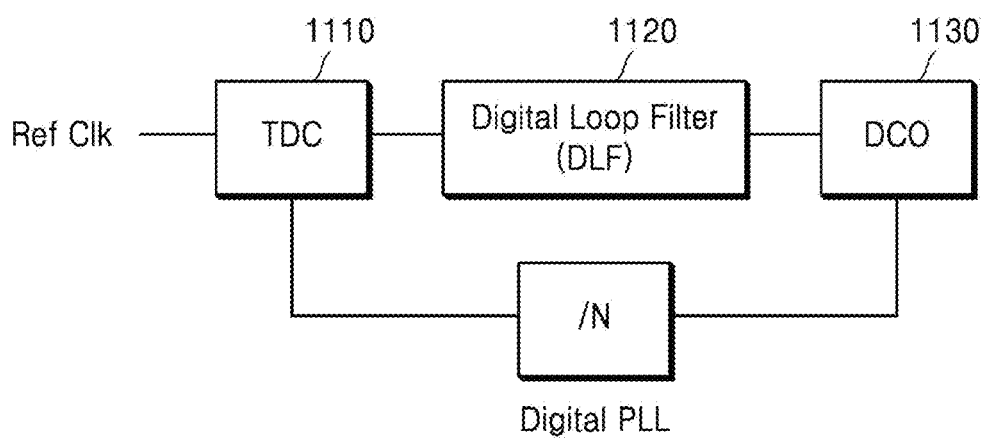
FIG. 10 is a block diagram of a digital clock data recovery circuit according to an embodiment.

FIG. 10 is a block diagram of a digital clock data recovery circuit 1100 according to an embodiment.

Referring to FIG. 10, the digital clock data recovery circuit 1100 may include a time to digital converter (TDC) 1110, a digital loop filter 1120, and a DCO 1130.

According to an embodiment, the TDC 1110 may receive a reference clock signal Ref CLK and a clock signal divided by the DCO 1130. The TDC 1110 may compare a point in time at which the reference clock signal Ref CLK is received with a point in time at which the divided clock signal is received to detect a time difference. For example, the TDC 1110 may generate skew information representing the time difference. For example, the TDC 1110 may receive the reference clock signal Ref CLK at a first point in time and may receive the clock signal divided by the DCO 1130 at a second point in time later than the first point in time. At this time, the TDC 1110 may determine how many clock signals have passed according to the reference clock signal between the first point in time and the second point in time and may generate the skew information.

According to an embodiment, the digital loop filter 1120 may receive the skew information from the TDC 1110 to control the phase of the clock signal so that the clock signal divided by the DCO 1130 and the reference clock signal Ref CLK are locked in with each other. The digital loop filter 1120 may determine that the data and clock signal are locked in with each other when a value of the phase error signal Δpi is dithering near "0". For example, the digital loop filter 1120 may receive a leading value or a lagging value of the phase of the clock signal received from the TDC 1110 and may generate a DCO control code to provide the generated DCO control code to the DCO 1130. According to an embodiment, the DCO 1130 may generate a signal of a variable frequency based on the DCO control code received from the digital loop filter 1120.

Figure 11:
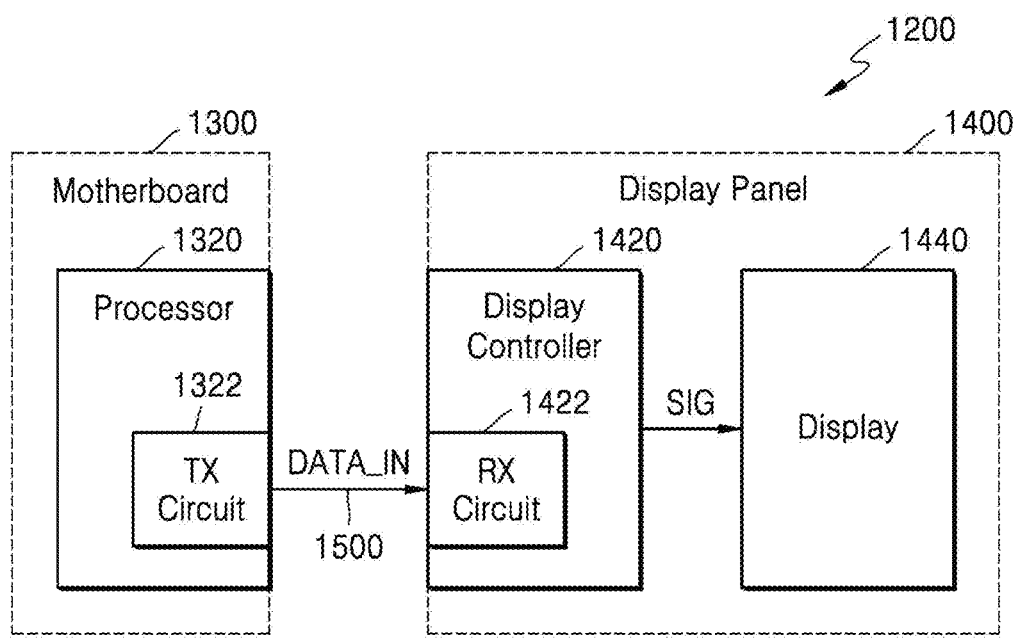
FIG. 11 is a block diagram illustrating a device including a clock data recovery circuit according to an embodiment.

FIG. 11 is a block diagram illustrating a device including a clock data recovery circuit according to an embodiment.

The clock data recovery circuit according to the embodiment may be included in a receiving circuit 1422. The device may be a computing system including a display panel 1400 and, as a non-limiting example, a stationary system, such as a desktop computer, a server, a TV set, or a billboard, or a mobile system, such as a laptop computer, a mobile phone, a tablet PC, or a wearable device. As illustrated in FIG. 11, the device may include a motherboard 1300 and the display panel 1400, and an input data signal DATA_IN may be transmitted from the motherboard 1300 to the display panel 1400 through a data line 1500.

The motherboard 1300 may include a processor 1320, and the processor 1320 may include a transmitting circuit 1322. The processor 1320 may refer to a processing unit performing a computational operation such as a microprocessor, a microcontroller, an application specific integrated circuit (ASIC), or a field programmable gate array (FPGA). In some embodiments, the processor 1320 may be a video graphics processor, such as a graphics processing unit (GPU). The processor 1320 may generate image data corresponding to an image output through a display 1440 included in the display panel 1400, and the image data may be provided to the transmitting circuit 1322.

The transmitting circuit 1322 may output the input data signal DATA_IN to the receiving circuit 1422 for a clock data recovering operation of the receiving circuit 1422. The display panel 1400 may include a display controller 1420 and the display 1440. The display controller 1420 may receive the input data signal DATA_IN from the motherboard 1300, and may perform the clock data recovering operation by using the input data signal DATA_IN. In some embodiments, the display controller 1420 may provide a display signal SIG for controlling pixels included in the display 1440, and may be referred to as a display driver integrated circuit (DDI).

The display controller 1420 may include the receiving circuit 1422, and the receiving circuit 1422 may receive the input data signal DATA_IN. The receiving circuit 1422 may include the clock data recovery circuit according to the embodiments and may generate recovered clock signals and recovered data from the input data signal DATA_IN. The clock data recovery circuit included in the receiving circuit 1422 may include a digital loop filter for minimizing a phase difference between a recovered clock signal and input data.

The display 1440 may include an arbitrary type of display, such as a liquid crystal display (LCD), a light emitting diode (LED) display, an electroluminescent display (ELD), a cathode ray tube (CRT) display, a plasma display panel (PDP) display, or a liquid crystal on silicon (LCoS) display as a non-limiting example. In FIG. 11, the device is illustrated as including the display panel 1400. However, in some embodiments, the device may include two or more display panels, that is, two or more displays.

Figure 12:
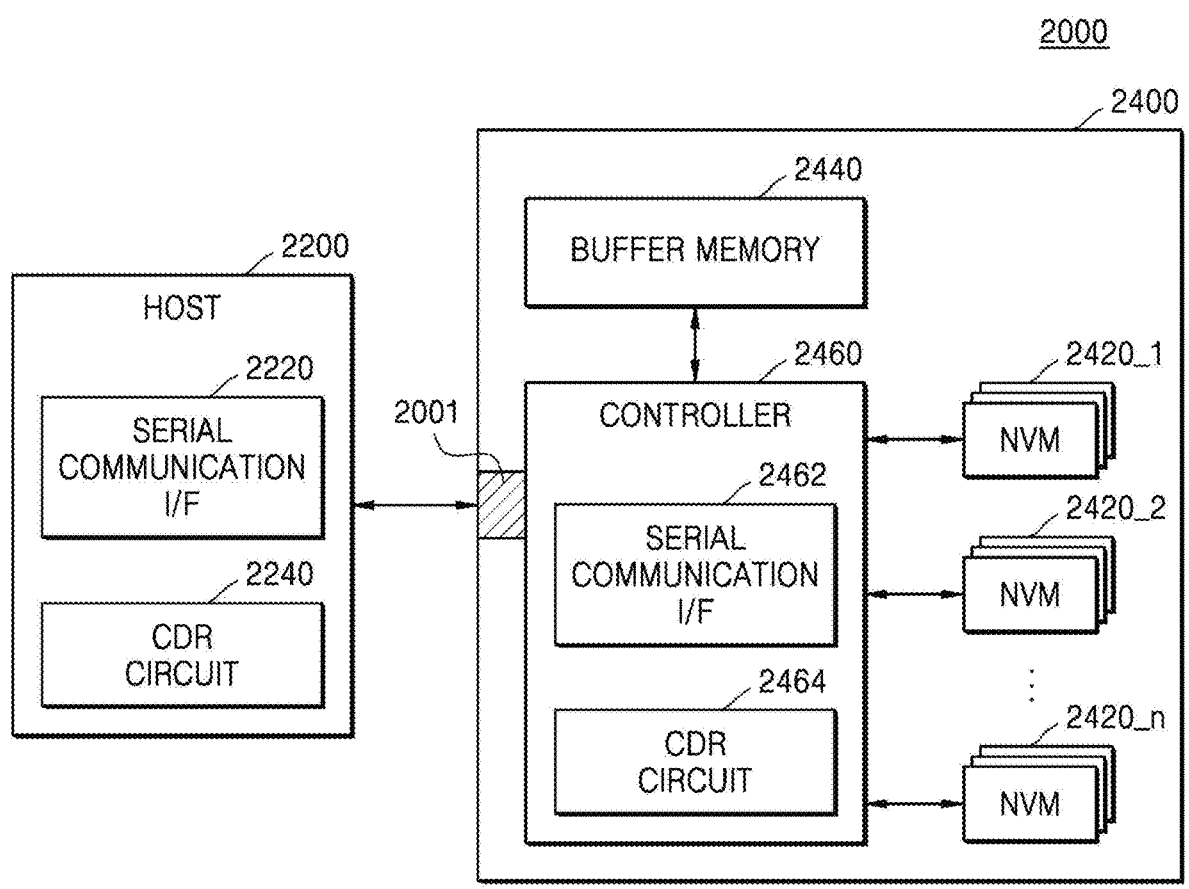
FIG. 12 is a block diagram illustrating a system including clock data recovery circuits according to an embodiment.

FIG. 12 is a block diagram illustrating a system 2000 including clock data recovery circuits 2240 and 2464 according to an embodiment.

Referring to FIG. 12, the system 2000 may include a host 2200 and a storage device 2400. The storage device 2400 may be referred to as a memory system or a storage system, and may include a signal connector 2001, a plurality of non-volatile memories 2420_1 to 2420_n, a buffer memory 2440, and a controller 2460. For example, the controller 2460 may be referred to as a memory controller or a storage controller.

The storage device 2400 may transmit and receive a signal to and from the host 2200 through the signal connector 2001. The host 2200 and the storage device 2400 may communicate with each other through an electrical signal and/or a light signal, and as a non-limiting example, may communicate with each other through a universal flash storage (UFS) interface, a serial advanced technology attachment (SATA) interface, an SATA express (SATAe) interface, a small computer small interface (SCSI) interface, a serial attached SCSI (SAS) interface, a peripheral component interconnect express (PCIe) interface, a non-volatile memory express (NVMe) interface, an advanced host controller interface (AHCI) interface, or a combination of the above communication interfaces.

The controller 2460 may control the plurality of non-volatile memories 2420_1 to 2420_n in response to the signal received from the host 2200. The controller 2460 may include a serial communication interface circuit 2462 for transmitting and receiving data, and may include the clock data recovery circuit 2464 to which the embodiments are applied in order to recover a clock signal and data of a received serial data signal. The serial communication interface circuit 2462 may provide the communication interfaces such as the UFS interface, the SATA interface, the SATAe interface, the SCSI interface, the SAS interface, the PCIe interface, the NVMe interface, and the AHCI interface. The buffer memory 2440 may operate for the storage device 2400. On the other hand, the host 2200 may include a serial communication interface circuit 2220 for transmitting and receiving data and the clock data recovery circuit 2240 to which the embodiments are applied.

Each of the plurality of non-volatile memories 2420_1 to 2420_n may include a memory cell array, the memory cell array may include memory blocks, each of the memory blocks may be divided into pages, and each of the pages may include non-volatile memory cells, for example, at least one NAND flash memory cell.

While the inventive concept has been particularly shown and described with reference to embodiments thereof, it will be understood that various changes in form and details may be made therein without departing from the spirit and scope of the following claims.

What is claimed is:

1. A clock data recovery circuit comprising:
a bang bang phase detector configured to receive data and a clock signal and determine whether a phase of the clock signal leads or lags a phase of the data;
a digital loop filter configured to receive an output of the bang bang phase detector and filter input jitter;
an accumulator configured to accumulate an output from the digital loop filter;
an encoder configured to encode an output of the accumulator to generate a phase interpolation code; and
a phase interpolator configured to generate the clock signal with an output phase in accordance with the phase interpolation code,
wherein the digital loop filter comprises a first sigma delta modulation (SDM) arithmetic block circuit connected to the bang bang phase detector,
wherein the digital loop filter further comprises a second SDM arithmetic block circuit connected to the first SDM arithmetic block circuit,
wherein the first SDM arithmetic block circuit performs a division operation on the output of the bang bang phase detector using a first SDM coefficient as a divisor, and
wherein the second SDM arithmetic block circuit performs a division operation on an output of the first SDM arithmetic block circuit using a second SDM coefficient as a divisor.

2. The clock data recovery circuit of claim 1,
wherein the first SDM coefficient is different from the second SDM coefficient.

3. The clock data recovery circuit of claim 1,
wherein the digital loop filter further includes:

an integrator connected to the second SDM arithmetic block circuit; and
an adder circuit connected to the first SDM arithmetic block circuit and the integrator and configured to sum an output of the first SDM arithmetic block circuit and an output of the integrator.

4. The clock data recovery circuit of claim 3,
wherein the first SDM arithmetic block circuit is included in a proportional path of the digital loop filter, the proportional path tracking a jitter input in a high frequency, and
wherein the second SDM arithmetic block circuit and the integrator are included in an integral path of the digital loop filter, the integral path tracking a jitter input in a low frequency.

5. The clock data recovery circuit of claim 1,
wherein the bang bang phase detector includes:
a first XOR gate configured to perform an XOR operation on the data at a falling edge of the clock signal and the data at a first rising edge of the clock signal to generate a first output representing of whether the phase of the clock signal leads the phase of the data; and
a second XOR gate configured to perform an XOR operation on the data at the falling edge of the clock signal and the data at a second rising edge of the clock signal to generate a second output representing whether the phase of the clock signal lags the phase of the data,
wherein the first rising edge precedes the falling edge, and
wherein the second rising edge follows the falling edge.

6. The clock data recovery circuit of claim 1,
wherein the phase interpolator controls the output phase in response to a change in the phase interpolation code, and
wherein the phase interpolation code is changed in response to that a value representing the phase of the clock signal leading the phase of the data, which is received from the bang bang phase detector, is greater than a predefined value or a value representing the phase of the clock signal lagging the phase of the data, which is received from the bang bang phase detector, is greater than a predefined value.

7. The clock data recovery circuit of claim 4,
wherein a first gain of the proportional path is less than 1, and
wherein a second gain of the integral path is less than the first gain of the proportional path.

8. A digital loop filter comprising:
a proportional path including a first sigma delta modulation (SDM) arithmetic block circuit; and
an integral path including a second SDM arithmetic block circuit and an integrator, the integral path being configured in parallel with the proportional path,
wherein the first SDM arithmetic block circuit performs a division operation on an input of the digital loop filter using a first SDM coefficient as a divisor, and
wherein the second SDM arithmetic block circuit performs a division operation on an output of the first SDM arithmetic block circuit using a second SDM coefficient as a divisor.

9. The digital loop filter of claim 8,
wherein a first gain of the proportional path is less than 1, and
wherein a second gain of the integral path is less than the first gain of the proportional path.

10. The digital loop filter of claim 8,
wherein the first SDM coefficient is different from the second SDM coefficient.

11. The digital loop filter of claim 8,
wherein the integrator is connected to the second SDM arithmetic block circuit, and
wherein the proportional path further comprises an adder circuit connected to the first SDM arithmetic block circuit and the integrator of the integral path and configured to sum an output of the first SDM arithmetic block circuit and an output of the integrator of the integral path.

12. The digital loop filter of claim 8,
wherein the proportional path tracks jitter input in a high frequency, and
wherein the integral path tracks jitter input in a low frequency.

13. A device comprising:
a receiving circuit; and
a transmitting circuit configured to transmit data to the receiving circuit through a channel,
wherein the receiving circuit comprises a clock data recovery circuit,
wherein the clock data recovery circuit includes:
   a bang bang phase detector configured to receive the data and a clock signal and determine whether a phase of the clock signal leads or lags a phase of the data;
   a digital loop filter configured to receive an output from the bang bang phase detector and filter input jitter;
   an accumulator configured to accumulate an output from the digital loop filter;
   an encoder configured to encode an output of the accumulator to generate a phase interpolation code; and
   a phase interpolator configured to generate the clock signal with an output phase in accordance with the phase interpolation code, wherein the digital loop filter comprises:
   a proportional path including a first sigma delta modulation (SDM) arithmetic block circuit; and
   an integral path parallel with the proportional path and including a second SDM arithmetic block circuit and an integrator,
wherein the first SDM arithmetic block circuit performs a division operation on the output of the bang bang phase detector using a first SDM coefficient as a divisor, and
wherein the second SDM arithmetic block circuit performs a division operation on an output of the first SDM arithmetic block circuit using a second SDM coefficient as a divisor.

14. The device of claim 13,
wherein the first SDM coefficient is different from the second SDM coefficient.

15. The device of claim 13,
wherein the integrator is connected to the second SDM arithmetic block circuit, and
wherein the proportional path further comprises an adder circuit connected to the first SDM arithmetic block circuit and the integrator of the integral path and configured to sum an output of the first SDM arithmetic block circuit and an output of the integrator of the integral path.

16. The device of claim 13,
wherein a first gain of the proportional path is less than 1, and
wherein a second gain of the integral path is less than the first gain of the proportional path.

17. The device of claim 13,
wherein the bang bang phase detector includes:
a first XOR gate configured to perform an XOR operation on the data at a falling edge of the clock signal and the data at a first rising edge of the clock signal to generate a first output representing of whether the phase of the clock signal leads the phase of the data; and
a second XOR gate configured to perform an XOR operation on the data at the falling edge of the clock signal and the data at a second rising edge of the clock signal to generate a second output representing of whether the phase of the clock signal lags the phase of the data,
wherein the first rising edge precedes the falling edge,
wherein the second rising edge follows the falling edge,
wherein the phase interpolator controls the output phase in response to a change in the phase interpolation code, and
wherein the phase interpolation code is changed in response to that a value representing the phase of the clock signal leading the phase of the data, which is received from the bang bang phase detector, is greater than a predefined value or a value representing the phase of the clock signal lagging the phase of the data, which is received from the bang bang phase detector, is greater than a predefined value.

* * * * *